United States Patent
Shah et al.

(10) Patent No.: US 11,367,628 B2
(45) Date of Patent: Jun. 21, 2022

(54) MOLDED CHIP PACKAGE WITH ANCHOR STRUCTURES

(71) Applicant: ADVANCED MICRO DEVICES, INC., Santa Clara, CA (US)

(72) Inventors: Priyal Shah, San Jose, CA (US); Milind S. Bhagavat, Los Altos, CA (US); Brett P. Wilkerson, Austin, TX (US); Lei Fu, Austin, TX (US); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/513,450

(22) Filed: Jul. 16, 2019

(65) Prior Publication Data

US 2021/0020459 A1    Jan. 21, 2021

(51) Int. Cl.
  *H01L 21/56* (2006.01)
  *H01L 23/31* (2006.01)

(52) U.S. Cl.
  CPC ........ *H01L 21/566* (2013.01); *H01L 23/3157* (2013.01)

(58) Field of Classification Search
  CPC .............. H01L 21/566; H01L 23/3157; H01L 21/6835; H01L 21/568; H01L 23/562; H01L 23/16; H01L 23/3128; H01L 23/3142; H01L 2924/181
  USPC ....... 257/787, 730, 737, 724, 676, 712, 729, 257/774, 777, E23.006, E23.007, 257/E23.003, E23.036, E23.067, E23.069, 257/E23.127, E25.012; 438/108, 107, 438/126, 127
  See application file for complete search history.

(56) References Cited

U.S. PATENT DOCUMENTS

| | | | |
|---|---|---|---|
| 9,478,504 B1 | 10/2016 | Shen et al. | |
| 2002/0172026 A1 | 11/2002 | Chong et al. | |
| 2003/0016133 A1 | 1/2003 | Egbert | |
| 2005/0280139 A1* | 12/2005 | Zhao | H01L 23/4334 257/704 |
| 2008/0284047 A1* | 11/2008 | Tosaya | H01L 23/16 257/787 |
| 2009/0135574 A1 | 5/2009 | Tanaka et al. | |
| 2011/0010932 A1 | 1/2011 | Tanaka et al. | |
| 2012/0007211 A1 | 1/2012 | Aleksov et al. | |
| 2012/0286419 A1 | 11/2012 | Kwon et al. | |
| 2013/0049127 A1 | 2/2013 | Chen et al. | |
| 2013/0062760 A1 | 3/2013 | Hung et al. | |
| 2013/0168854 A1 | 7/2013 | Karikalan et al. | |
| 2014/0102768 A1 | 4/2014 | Shizuno et al. | |

(Continued)

OTHER PUBLICATIONS

Ron Huemoeller et al.; *Silicon Wafer Integrated Fan-Out Technology*; ChipScaleReview.com; Mar. & Apr. 2015; pp. all.

*Primary Examiner* — Dao H Nguyen

(57) ABSTRACT

Various semiconductor chip packages are disclosed. In one aspect, a semiconductor chip package includes a package substrate that has a first side and a second side opposite to the first side. A semiconductor chip is mounted on the first side. Plural metal anchor structures are coupled to the package substrate and project away from the first side. A molding layer is on the package substrate and at least partially encapsulates the semiconductor chip and the anchor structures. The anchor structures terminate in the molding layer and anchor the molding layer to the package substrate.

17 Claims, 11 Drawing Sheets

(56) References Cited

U.S. PATENT DOCUMENTS

| | | |
|---|---|---|
| 2014/0264791 A1 | 9/2014 | Manusharow et al. |
| 2014/0332966 A1 | 11/2014 | Xiu et al. |
| 2015/0001717 A1 | 1/2015 | Karhade et al. |
| 2015/0001733 A1 | 1/2015 | Karhade et al. |
| 2015/0048515 A1 | 2/2015 | Zhang et al. |
| 2015/0092378 A1 | 4/2015 | Roy et al. |
| 2015/0228583 A1 | 8/2015 | Karhade et al. |
| 2015/0340459 A1 | 11/2015 | Lee |
| 2016/0085899 A1 | 3/2016 | Qian et al. |
| 2016/0181189 A1 | 6/2016 | Qian et al. |
| 2016/0293581 A1* | 10/2016 | Lin ..................... H01L 24/20 |
| 2018/0040546 A1 | 2/2018 | Yu et al. |
| 2019/0164914 A1* | 5/2019 | Hu ..................... H01L 23/585 |
| 2021/0057354 A1* | 2/2021 | Eid ..................... B33Y 80/00 |

* cited by examiner

MOLDED CHIP PACKAGE WITH ANCHOR STRUCTURES

BACKGROUND OF THE INVENTION

Conventional packaged semiconductor chips include a package substrate of one sort or another and one or more semiconductor chips mounted thereon. Conventional semiconductor chip package substrates come in a variety of configurations including build up layer designs, ceramic monolithic designs, and fan-out packages. Some types of conventional build up package substrates incorporate a central core upon which one or more build up layers are fabricated on opposing sides of the core. Other conventional designs utilize a so-called coreless design which incorporates build-up layers stacked upon one another. Conventional semiconductor chips are typically fabricated from semiconductor materials such as silicon and exhibit a significantly different coefficient of thermal expansion (CTE) than an underlying organic build up type substrate. The differences in CTE between the chip and the package substrate can produce significant warpage of the package substrate. To alleviate some of the risk of chip fracture due to warpage, an underfill material layer is typically interposed between the chip and the package substrate and consists of an epoxy or other type of polymer compound that has a CTE that is somewhat midway between the CTE of the chip and CTE of the underlying package substrate.

One conventional package utilizes a coreless or thin core build-up substrate with a molding layer encapsulating the semiconductor chip and decoupling capacitors. A similar conventional package known as Recon Technology supplied by Broadcom utilizes a coreless or thin core substrate with a molding layer encapsulating the semiconductor chip and decoupling capacitors and the peripheral edge of the package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
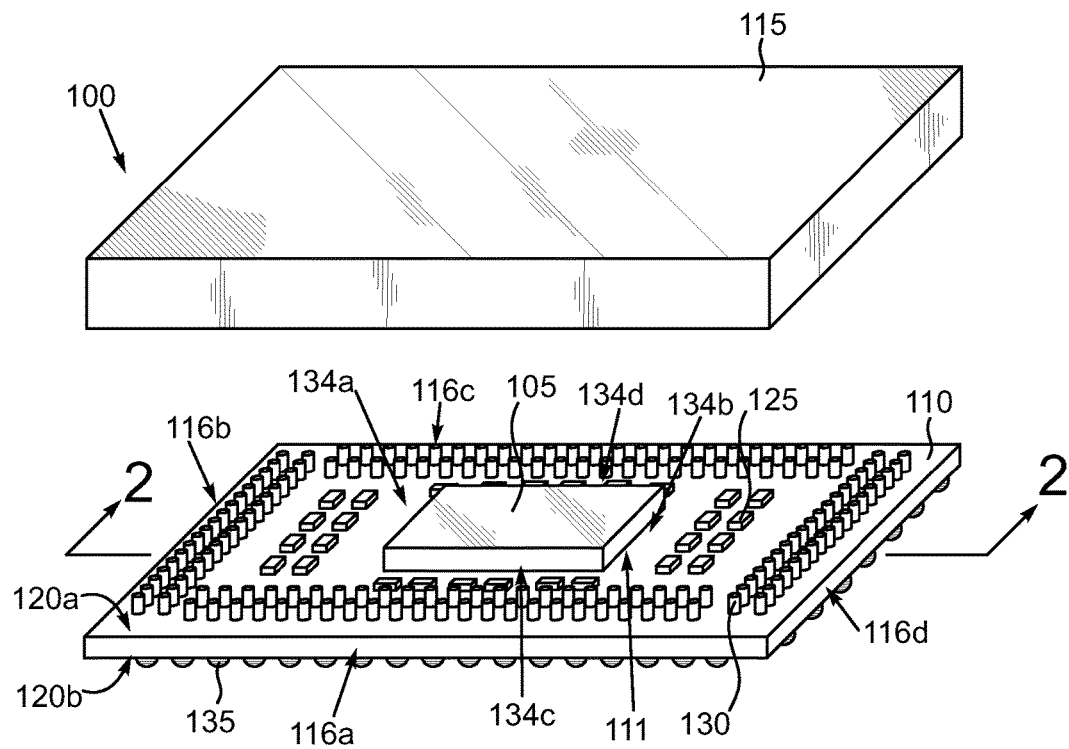
FIG. 1 is a partially exploded pictorial view of an exemplary arrangement of a semiconductor chip package.

In core-based build-up layer designs for package substrates, the core layer imparts stiffness to the substrate and reduces the overall CTE thereof. Accordingly, the core provides stability to the package substrate and reduces warpage during assembly and/or thermal cycling of the substrate. However, the usage of a core tends to degrade the electrical performance of the package substrate since it requires somewhat longer through-substrate-vias in order to make the requisite electrical pathways between input/output structures, such as solder balls, and the chip that is connected on the opposite side of the package substrate. Coreless substrates eliminate the disadvantages of core-based packages, but tend to lack the stiffness that a similarly configured core-based package exhibits and thus can lead to instability and high warpage. Therefore, the usage of a coreless substrate presents a lower boundary on the minimum thickness that can be achieved with such substrates. The two conventional molded packages mentioned in the Background section above present a risk of molding layer delamination from the package substrate.

The disclosed arrangements can provide a thin core or coreless build-up semiconductor chip package substrate while maintaining sufficient stiffness and stability. In this way, the disclosed packages can be made very thin, perhaps on the order of less than a millimeter, including any input/output structures, without necessarily raising the risk of significant warpage and the damage that may result therefrom. One arrangement uses plural anchor structures that are designed to project away from a side of a semiconductor chip package substrate and be physically engaged by a molding layer that at least partially encapsulates a chip mounted on the substrate. The plural anchors physically engage and anchor the molding layer to the package substrate and thereby reduce the possibility of molding delamination and also generally increase the stiffness of the package. Other arrangements utilize a stiffener ring that includes plural openings in which molding material can invade and after drying provide mechanical connections between the molding and the stiffener frame to again reduce the risk of delamination of the molding layer and increase the stiffness of the package.

In accordance with one aspect of the present invention, a semiconductor chip package includes a package substrate that has a first side and a second side opposite to the first side. A semiconductor chip is mounted on the first side. Plural metal anchor structures are coupled to the package substrate and project away from the first side. A molding layer is on the package substrate and at least partially encapsulates the semiconductor chip and the anchor structures. The anchor structures terminate in the molding layer and anchor the molding layer to the package substrate.

In accordance with another aspect of the present invention, a method of manufacturing a semiconductor chip package includes fabricating plural metal anchor structures on a first side of a package substrate. The package substrate has a central region configured to have a semiconductor chip mounted thereon. The anchor structures are positioned outside the central region and project away from the first side.

In accordance with another aspect of the present invention, a semiconductor chip package includes a package substrate that has a first side and a second side opposite to the first side. A semiconductor chip is mounted on the first side. A stiffener ring is mounted on the first side. The stiffener ring has a central opening to accommodate the semiconductor chip and plural openings. A molding layer is on the package substrate and at least partially encapsulates the semiconductor chip and the stiffener ring. The plural openings are filled with portions of the molding layer wherein physical engagement of the portions in the plural openings anchor the molding layer to the package substrate.

In accordance with another aspect of the present invention, a method of manufacturing a semiconductor chip package substrate includes mounting a semiconductor chip on a first side of a package substrate. The package substrate has a central region configured to the semiconductor chip mounted thereon. A stiffener ring is mounted on the first side of a package substrate. The stiffener ring has a central opening to accommodate the semiconductor chip and plural openings. A molding layer is molded on the package substrate and at least partially encapsulates the semiconductor chip and the stiffener ring. The plural openings are filled with portions of the molding layer wherein physical engagement of the portions in the plural openings anchor the molding layer to the package substrate.

In the drawings described below, reference numerals are generally repeated where identical elements appear in more than one figure. Turning now to the drawings, and in particular to FIG. 1, therein is shown a partially exploded pictorial view of an exemplary semiconductor chip package 100 that includes a semiconductor chip 105 mounted on a package substrate 110. The package substrate 110 includes a central region configured to have the semiconductor chip 105 mounted thereon. A molding layer 115 is molded on the package substrate 110 but is shown exploded from the package substrate 110 in FIG. 1. The semiconductor chip 105 can be virtually any kind of integrated circuit. Examples include interposers, microprocessors, graphics processors, combined microprocessor/graphics processors, application specific integrated circuits, memory devices or the like, and can be single or multi-core. The semiconductor chip 105 can be constructed of bulk semiconductor, such as silicon or germanium, or semiconductor-on-insulator materials, such as silicon-on-insulator materials or even insulator materials. Thus, the term "semiconductor chip" even contemplates insulating materials. Stacked dice can be used if desired.

The package substrate 110 includes multiple edges 116a, 116b, 116c and 116d and can be a monolithic or a laminate structure. A build up design is one example of a laminate. In this regard, the package substrate 110 can consist of a central thin core upon which one or more build-up layers are formed and below which an additional one or more build-up layers are formed. Various well-known types of build-up layer materials, such as GX13 supplied by Ajinomoto, Ltd. or other types can be used. The core itself can consist of a stack of one or more layers. So-called "coreless" designs can may be used as well. The layers of the package substrate 110 can consist of an insulating material, such as various well-known epoxies or other resins interspersed with metal interconnects. A multi-layer configuration other than build-up could be used, such as redistribution layer structure processing, prepreg sheets, B-stage layers or others. Optionally, the package substrate 110 can be composed of well-known ceramics or other materials suitable for package substrates or other printed circuit boards.

The package substrate 110 includes opposite sides 120a and 120b. The side 120a of the package substrate 110 is populated not only by the semiconductor chip 105 but also by plural surface components 125, which can be capacitors, inductors, resistors or even other types of electronic devices. In addition, the side 120a is populated by plural anchor structures 130 positioned generally outside the central region 111 and which are designed to mechanically engage and thereby anchor the molding layer 115 to the package substrate 110 to prevent delamination of the molding layer 115. Here, there are scores of anchor structures 130 that project away from the side 120a and are arranged around the perimeter of the semiconductor chip 105 and the surface components 125. The risk of delamination of the molding layer 115 due to warpage forces is greatest proximate the edges 116a, 116b, 116c and 116d of the package substrate 110, so it is desirable to position the anchor structures 130 at those locations. While the surface components 125 are positioned on opposite sides 134a and 134b and 134c and 134d of the semiconductor chip 105 in this arrangement, optionally, the surface components 125 and the anchor structures 130 can be positioned in various locations other than what is illustrated. To interface electrically with some other circuit board or electronic device, the side 120b of the package substrate 110 is provided with plural interconnects 135, which can be solder balls as illustrated or pins, lands or other types of interconnect structures.

Figure 2:
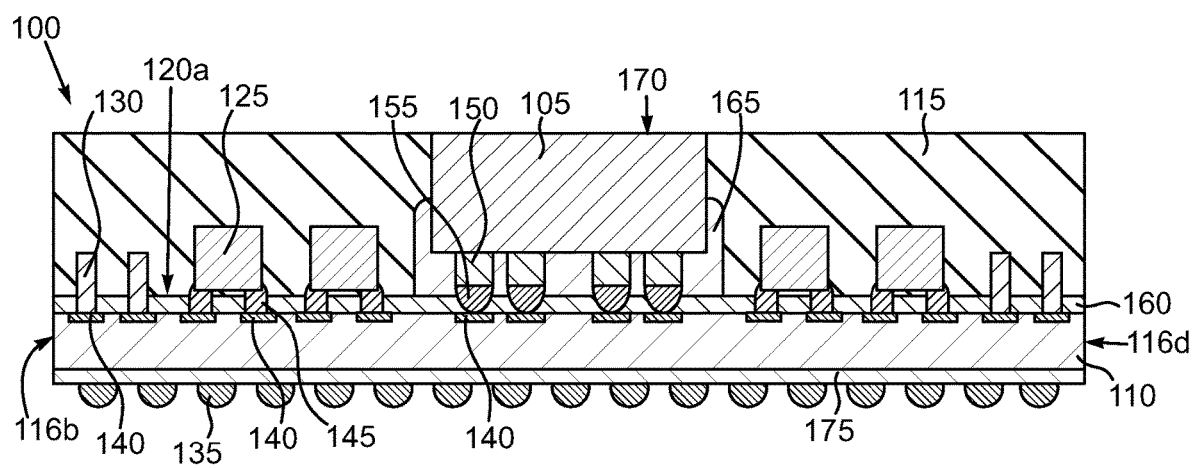
FIG. 2 is a sectional view of FIG. 1 taken at section 2-2.

Additional details of the semiconductor chip package 100 can be understood by referring now also to FIG. 2, which is a sectional view of FIG. 1 taken at section 2-2 albeit with the molding layer 115 in its normal position and not exploded as shown in FIG. 1. Here, a few of the anchor structures 130 proximate one edge 116b and some proximate the other edge 116d are visible. Each of the anchor structures 130 is fabricated with one end on a respective conductor pad 140 that is formed in the uppermost region of the package substrate 110 and a second and opposite end that is distal to the side 120a and terminates in the molding layer 115. Indeed, it should be understood, that the package substrate 110 in this illustrative arrangement consists of plural levels of build-up polymer and metallization layers (not shown). The conductor pads 140 serving as foundations for the anchor structures are preferably electrically floating or connected to a ground pathway, and not to power or signal pathways. The surface components 125 are similarly connected to one or more of the conductor pads 140 by way of solder structures 145, albeit to ground, power or other pathways. In addition, the semiconductor chip 105 is connected to the package substrate 110 by way of plural conductive pillars 150 that include respective solder caps 155 that in turn connect to one or more of the conductor pads 140. Of course, other types of interconnect structures besides connective pillars could be used for the chip 105, such as solder bumps or others. The solder structures 145, the solder caps 155 and other solder structures disclosed herein can be composed of various lead-free solders. Lead-free examples include tin-silver (about 97.3% Sn 2.7% Ag), tin-copper (about 99% Sn 1% Cu), tin-silver-copper (about 96.5% Sn 3% Ag 0.5% Cu) or the like.

The anchor structures 130, the solder structures 145 and the solder caps 155 project down through a solder resist layer 160 that is fabricated on the upper surface of the package substrate 110. The solder resist layer 160 can be composed of well-known solder resist materials. As described in more detail below, openings through the solder resist 160 are established by way of photolithography where the solder resist 160 includes photoactive compounds and is capable of being exposed and developed to yield the desired openings. An underfill material 165 is disposed between the semiconductor chip 105 and the solder resist 160 in order to cushion the effects of differences in CTE between the chip 105 and the package substrate 110. Well-known underfill materials, such as various epoxies, can be used. Here, the anchor structures 130 are generally cylindrical structures that are metallurgically bonded to the underlying conductor pads 140. However, and as described in more detail below and shown in subsequent figures, various types of footprints other than cylindrical can be used for the anchor structures 130.

The molding layer 115 is advantageously composed of well-known molding materials. Desirable properties include a modulus that is high enough to provide stiffness, for example, about 14 to 15 Gpa, and a CTE greater than that of the package substrate 110. One example has a CTE about 17 ppm/C° or higher. In an exemplary arrangement the materials for the molding material 115 can have a molding temperature of about 165° C. and duration of about one hour. Two commercial variants are Sumitomo EME-G750 and G760. Others supplied by Hitachi, Nagase or Kyocera could be used. Well-known compression molding techniques can be used to mold the molding material 115. Note that the molding layer 115 in this illustrative arrangement has been subjected to a grinding process to reveal the upper surface 170 of the semiconductor chip 105. This chip reveal is desirable in circumstances where some type of thermal solution such as a heat sink or heat spreader will be placed in thermal contact with the upper surface 170. Another solder resist layer 175 is fabricated on the lower side of the package substrate 110 and suitably patterned with various openings (not shown) in which the interconnects 135 project to make contact with metallization (not shown) of the package substrate 110. The solder resist layer 175 can be constructed using the same materials disclosed above for the solder resist layer 160.

Figure 3:
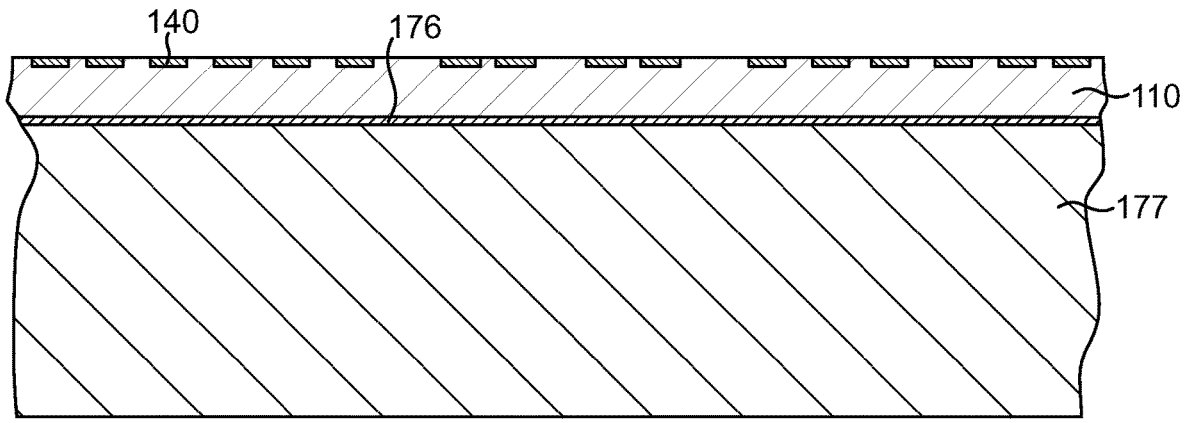
FIG. 3 is a sectional view depicting initial fabrication of a semiconductor chip package substrate.
Figure 4:
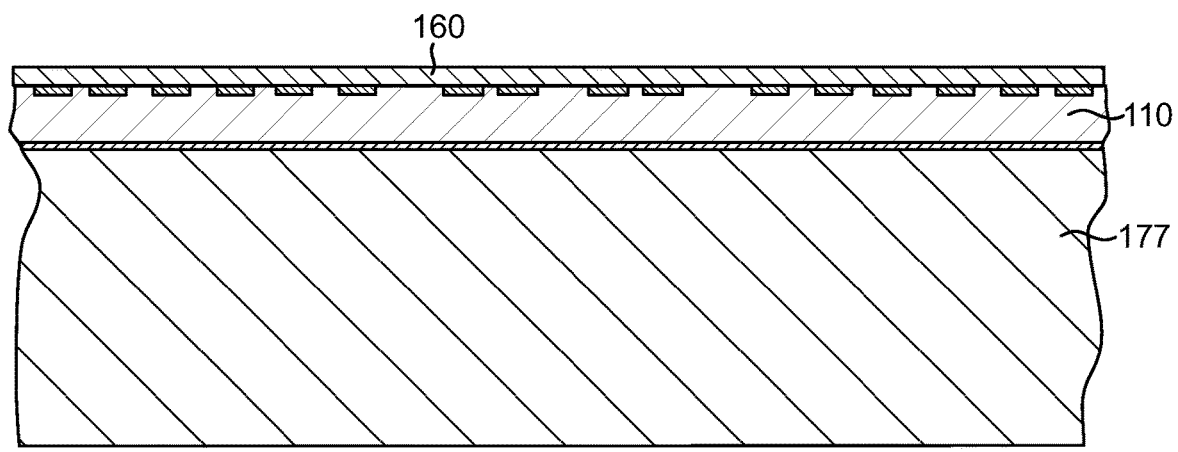
FIG. 4 is a sectional view like FIG. 3 but depicting fabrication of a solder resist layer.

An exemplary method for fabricating the semiconductor chip package 100 can be understood by referring now to FIGS. 3, 4, 5, 6, 7, 8, 9, 10, 11 and 12 and initially to FIG. 3. The process begins with a fabrication of the package substrate 110. Initially, a release layer 176 is applied to a carrier wafer 177. The release layer 176 can be a light activated, thermally activated, or other type of adhesive or even some form of tape that can enable the carrier wafer 177 to be removed without destructively damaging the structures mounted thereon at the time of separation. The carrier wafer 177 can be composed of various types of glasses or even semiconductors, such as silicon. This and subsequent processing can be performed on a wafer level or panel level. Next, the package substrate 110 is fabricated on the release layer 176. This can be accomplished using well-known techniques for applying metallization and build up layers. Two or more build up layers can be used in one exemplary arrangement and four to eight build up layers can be used in another. As noted above, the upper most metallization layer of the package substrate 110 includes the aforementioned conductor pads 140. As just noted, well-known metallization techniques can be used such as blanket deposition followed by suitable masking and etching in order to yield the desired patterns of electrical traces and pads. This is a subtractive process. However, it can also be performed using an additive process as desired. Next and as shown in FIG. 4, the solder resist layer 160 is applied to the package substrate 110 again using the carrier wafer 177 as a supportive structure. It should be understood that this processing method can be performed on a wafer or panel level basis such that the carrier wafer 177 is a much larger structure than what is depicted and multiple package substrates 110 can be fabricated at a time on the carrier wafer 177. The solder resist layer 160 can be applied using well-known spin coating and baking techniques.

Figure 5:
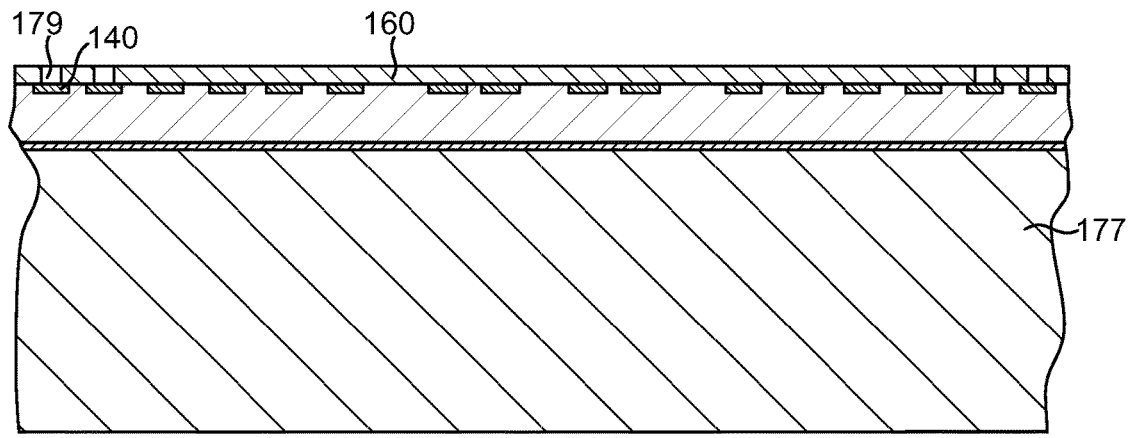
FIG. 5 is a sectional view like FIG. 4 but depicting exemplary patterning of the solder resist layer.

Next and as shown in FIG. 5, the solder resist layer 160 is processed to fabricate plural openings 179 therein that lead to the underlying conductor pads 140 where the anchor structures 130 will be fabricated. Note that at this point, other openings leading to other of the conductor pads 140 where the semiconductor chip 105 and the surface components 125 depicted in FIGS. 1 and 2 will eventually be mounted are not yet formed. Well-known photolithography, such as, masking, exposure and development can be used to fabricate the openings 179 where the solder resist layer 160 includes photoactive compounds. It might also be possible to form the openings 179 using a chemical etch or laser drilling operation.

Figure 6:
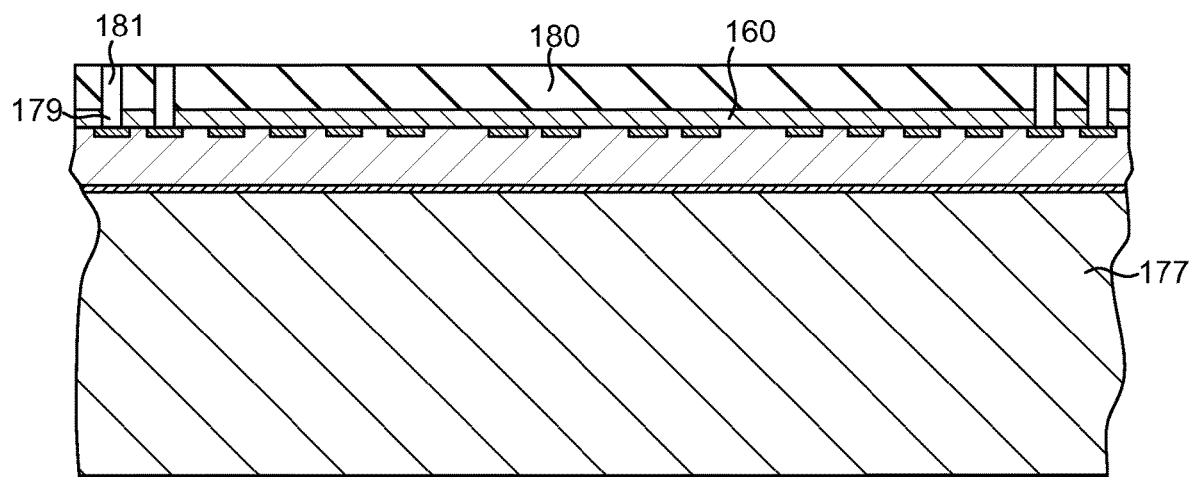
FIG. 6 is a sectional view like FIG. 5 but depicting fabrication and patterning of a photolithography mask.

Next and as shown in FIG. 6, a suitable photoresist mask 180 is fabricated on the solder resist layer 160 and photolithographically patterned to establish suitable openings 181 that are aligned with the openings 179 and thus will form openings in which the anchor structures 130 will ultimately be formed. The well-known photoresist spin coating application and baking techniques can be used as well as exposure and development in order to establish the openings 181.

Figure 7:
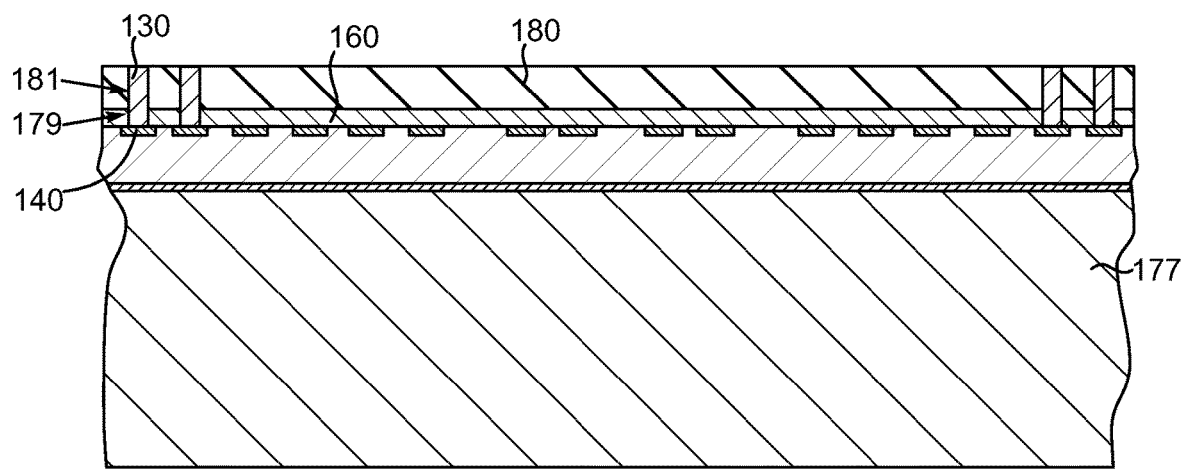
FIG. 7 is a sectional view like FIG. 6 but depicting exemplary plating of exemplary anchor structures.

Next and as shown in FIG. 7, a suitable plating process is performed to fabricate the anchor structures 130. The plating process to establish the anchor structures 130 can be an electroless plating process using, for example, copper, gold, silver, platinum, palladium, combinations of these or other materials capable of being plated. The anchor structures 130 are plated into metallurgical contact with the underlying conductor pads 140. The carrier wafer 177 serves as a supportive structure for these process steps. The anchor structures 130 fill the combined openings 181 and 179 in the photoresist mask 180 and 160, respectively.

Figure 8:
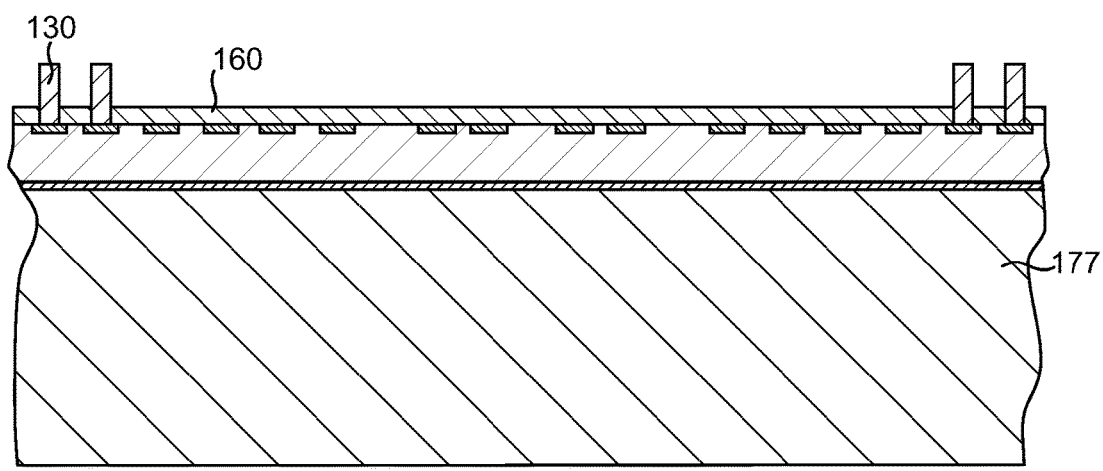
FIG. 8 is a sectional view like FIG. 7 but depicting stripping of the photolithography mask.

Next and as shown in FIG. 8, the photoresist mask 180 depicted in FIG. 7 is stripped using well-known ashing, and solvent stripping techniques. This leaves the upper reaches of the anchor structures 130 exposed as shown in FIG. 8. The carrier wafer 177 serves as a supportive structure during the mask strip process.

Figure 9:
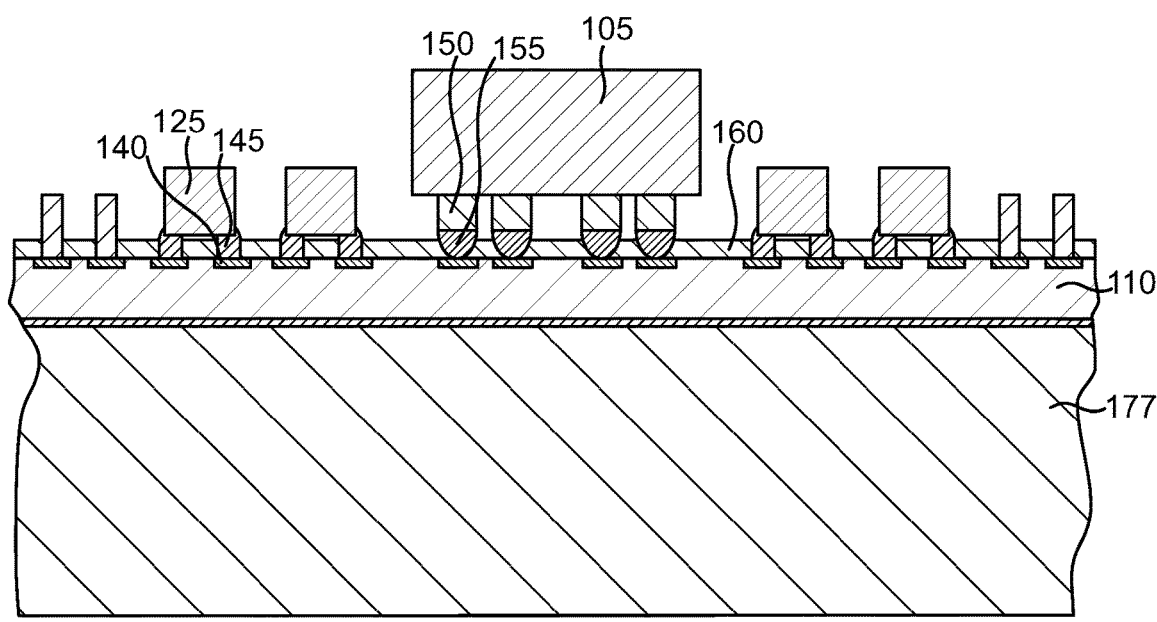
FIG. 9 is a sectional view like FIG. 8 but depicting exemplary surface component and semiconductor chip mounting.

Next and as shown in FIG. 9, the solder resist layer 160 is processed to establish plural openings therein to accommodate the aforementioned solder structures 145 of the surface components 125, the solder caps 155 of the conductive pillars 150 of the chip 105 and thereafter, the surface components 125 and the chip 105 are mounted using the solder structures 145 and the solder caps 155 and a subsequent reflow is performed in order to temporarily liquefy the solder structures 145 and the solder caps 155 followed by a cool down to yield metallurgical bonds to various of the underlying conductor pads 140 of the package substrate 110. The solder structures 145 can be fabricated using well-known solder stencil and solder paste techniques. The carrier wafer 177 serves as a supportive structure for these process steps.

Figure 10:
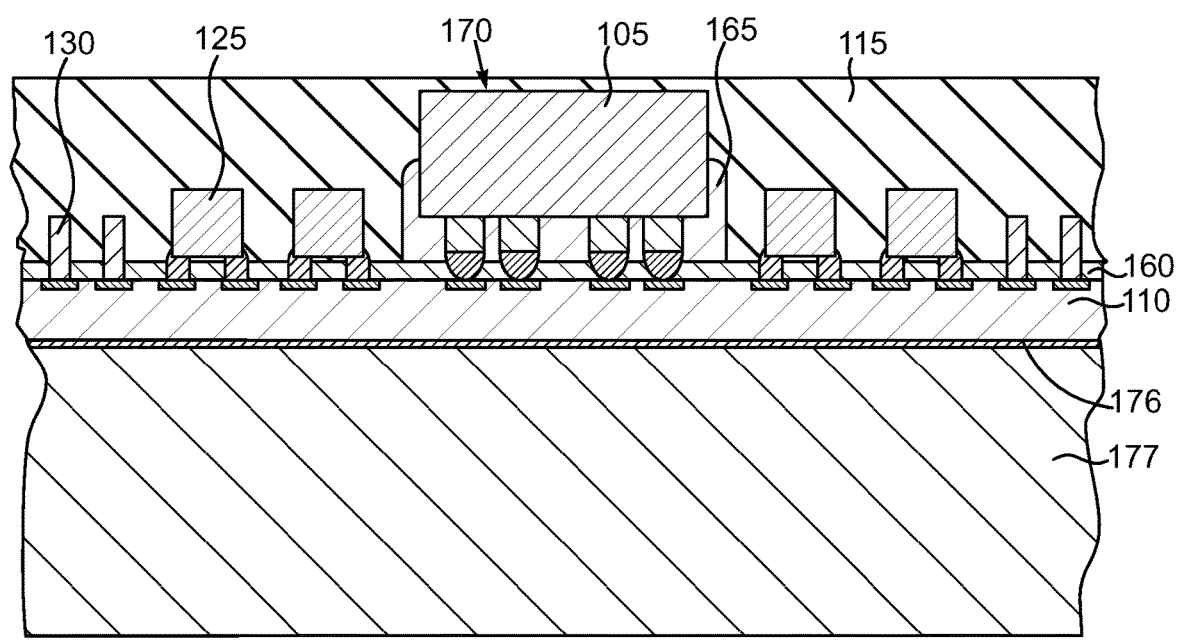
FIG. 10 is a sectional view like FIG. 9 but depicting exemplary molding of a molding layer on the package substrate.

Next and as shown in FIG. 10, the underfill 165 is applied using well-known capillary, molding or other techniques followed by a thermal cure. Next, the molding layer 115 is applied to the package substrate 110 and in particular the solder resist layer 160 thereon again using the materials and techniques disclosed above. As shown in FIG. 10, the molding layer 115 initially fully encapsulates the semiconductor chip 105 and covers the upper surface 170 thereof. The anchor structures 130 and the surface components 125 are fully encased. As noted above, the anchor structures 130 anchor the molding layer 115 to the package substrate 110 to prevent delamination.

Figure 11:
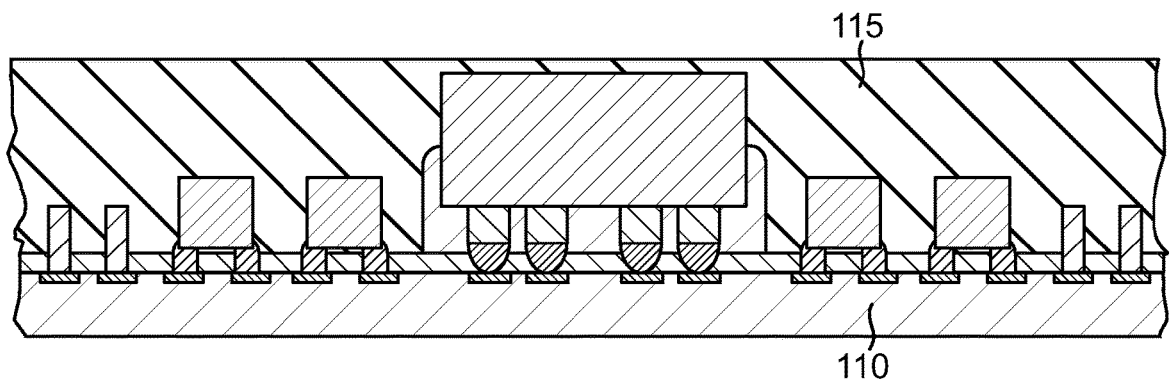
FIG. 11 is a sectional view like FIG. 10 but depicting exemplary removal of a carrier wafer.

Referring now also to FIG. 11, the release layer 176 is deactivated to detach the carrier wafer 177 from the package substrate 110. The deactivation is by way of whatever techniques are appropriate, such as, light, heat, etc. After the removal of the carrier wafer 177, shown in FIG. 11, the package substrate 110, the molding layer 115 and the components sandwiched therebetween make up a reconstituted wafer, a portion of which is shown in FIG. 11.

Figure 12:
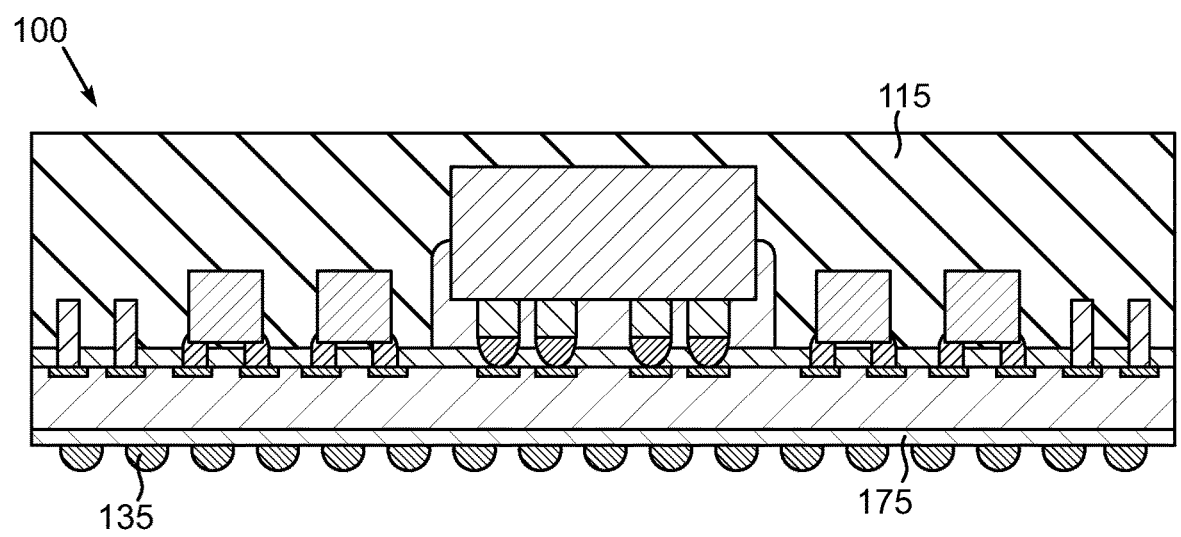
FIG. 12 is a sectional view like FIG. 11 but depicting exemplary additional solder resist and interconnect fabrication.

Referring now to FIG. 12, the package substrate 100 next undergoes a variety of processes to establish the solder resist layer 175 again using well-known spin coating and baking techniques, photolithography to establish the aforementioned openings (not shown) and pick and place or other techniques to fabricate the interconnects 135. Following these steps, the semiconductor chip package 100 can be singulated from the reconstituted wafer as shown in FIG. 12. A grinding process can be performed on the molding layer 115 to expose the upper surface 170 of the chip 105 and yield the completed structure that is depicted in FIG. 2. Optionally, the grinding of the molding layer 115 can precede removal of the carrier wafer 177.

Figure 13:
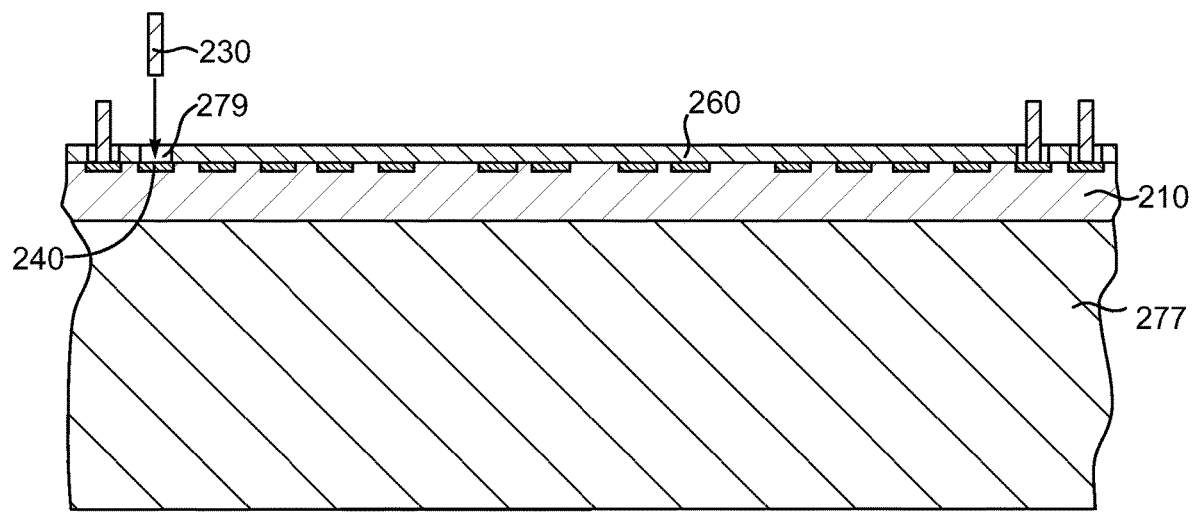
FIG. 13 is a sectional view depicting alternate exemplary fabrication of alternate exemplary anchor structures.

In an alternate exemplary arrangement, wire bonding techniques can be used to fabricate alternative anchor structures 230 as shown in FIG. 13. FIG. 13 is a sectional view like FIG. 8, and thus depicts an alternate exemplary package substrate 210. However, in lieu of plating the anchor structures 130 as in the other arrangement, the anchor structures 230 are attached to underlying conductor pads 240 using wire bonding techniques. Again, a carrier wafer 277 can be used to provide support during these process steps. A solder resist layer 260 is applied to the package substrate 210 and lithographically patterned to have plural openings 279 in which the wire bond style anchor structures 230 are mounted. In the arrangement depicted in FIG. 13, the wire bond style anchor structures 230 are generally cylindrical structures. It should be understood that the package substrate 210 can be processed using the techniques disclosed for the package substrate 110 depicted and described above before the application of the anchor structures 230 and subsequently the same types of techniques can be used to mount chips and surface components as well.

Figure 14:
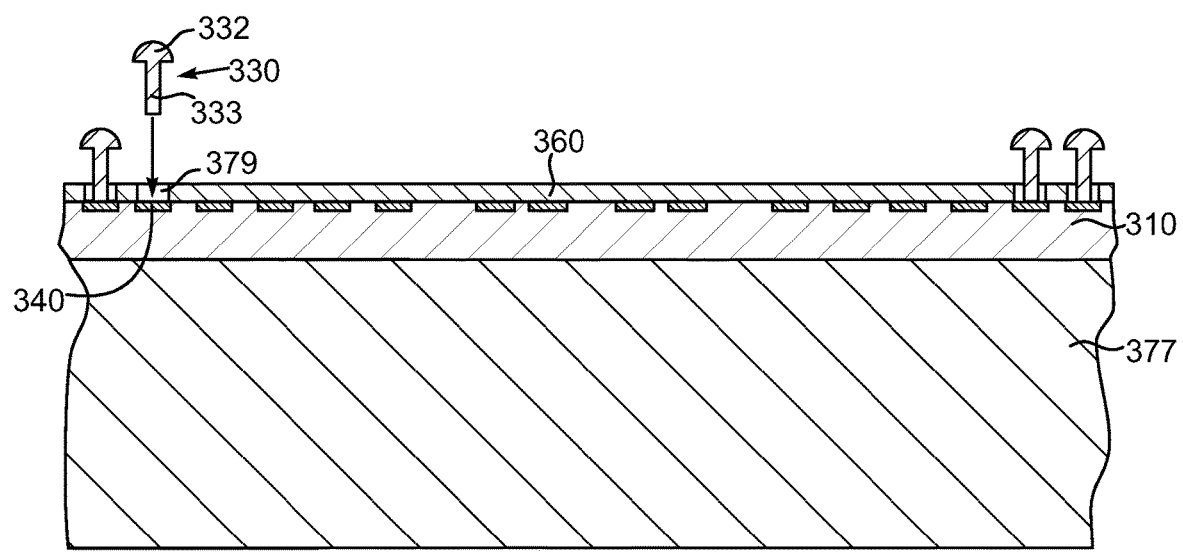
FIG. 14 is a section view like FIG. 13 depicting other alternate exemplary fabrication of alternate exemplary anchor structures.

In another alternate exemplary arrangement using wire bonding techniques, anchor structure 330 can have a coined head 332 and an integrally formed shank section 333 as shown in FIG. 14. FIG. 14 is a sectional view like FIG. 13. Here, in this illustrative arrangement, the wire bond style anchor structures 330 are mounted on the package substrate 310 which is supported by a carrier wafer 377 that includes a solder resist layer 360 and underlying conductor pads 340.

Figure 15:
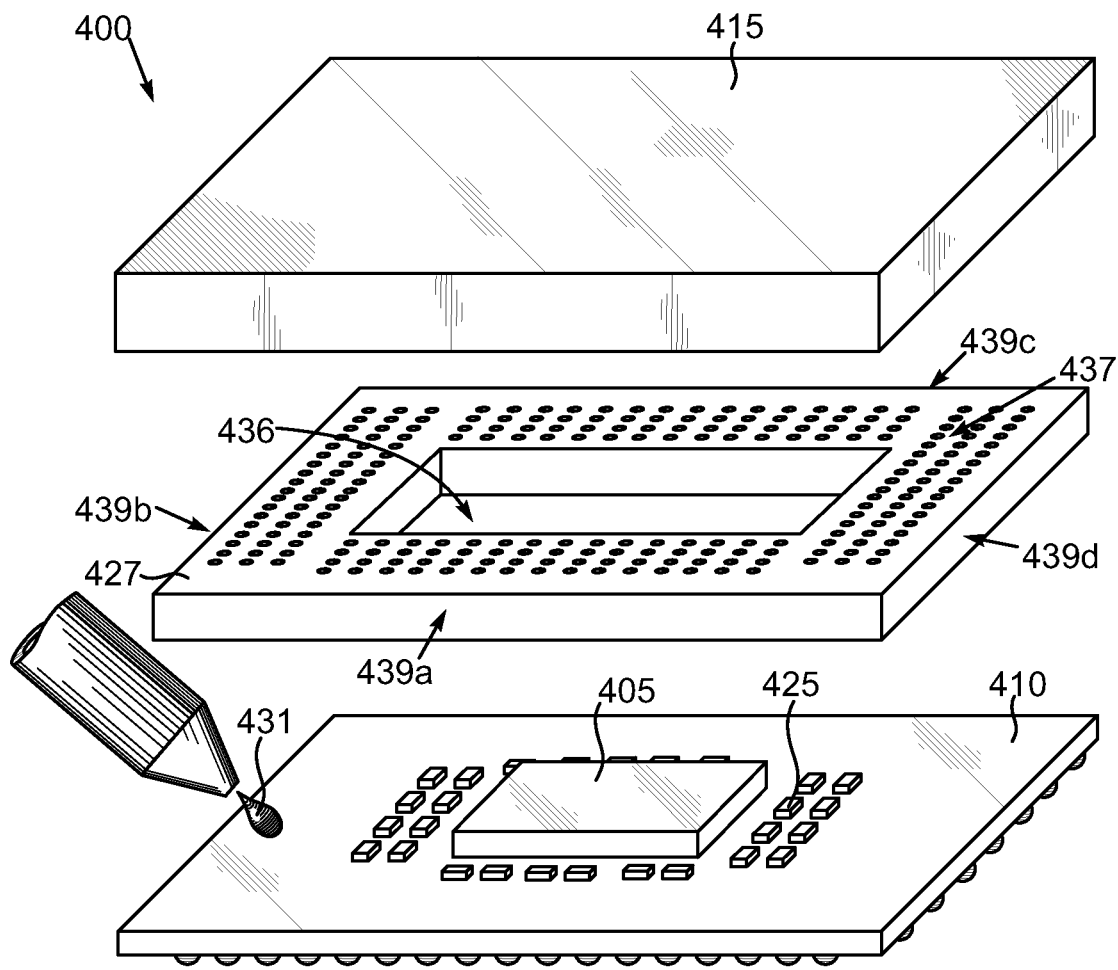
FIG. 15 is a partially exploded pictorial view depicting an alternate exemplary arrangement of a semiconductor chip package that incorporates a stiffener ring.

Another alternate exemplary arrangement of a semiconductor chip package 400 can be understood by referring now to FIG. 15, which is a partially exploded pictorial view. In this illustrative arrangement of the package 400, a semiconductor chip 405 is mounted on a package substrate 410 where the chip 405 and the package substrate 410 can be substantially like the chip 105 and package substrate 110 described elsewhere herein. Similarly, a molding layer 415, like the molding layer 115 described elsewhere herein, can be used to encapsulate the semiconductor chip 405 and surface components 425 that are mounted on the package substrate 410. However, in lieu of using plural small anchor structures that mechanically engage the molding layer 415, a stiffener ring 427 is used. The stiffener ring 427 is secured to the package substrate 410 by way of a suitable adhesive 431, which can be a well-known epoxy or other type of adhesive. The stiffener ring 427 includes a central opening 436 to accommodate the semiconductor chip 405 and the surface components 425 clustered around the semiconductor chip 405. In addition, the stiffener ring 427 includes plural openings 437, which in this illustrative arrangement consist of plural cylindrical holes that are designed to allow portions of the molding layer 415 to project down into during the molding process and thereby provide anchoring to the stiffener ring 427. The plural openings 437 can have other than a cylindrical shape. Note that the stiffener ring 427 is advantageously fabricated with a slightly smaller footprint than the package substrate 410 so that the molding layer 405 can mold around the sides 439a, 439b, 439c and 439d of the stiffener ring 427 during the molding process. In this way, the molding layer 415 can also mold to at least the perimeter of the upper surface of the package substrate 410. The stiffener ring 427 can be fabricated from aluminum, copper, stainless steel or the like, using stamping, machining, forging, casting or other fabrication techniques. The openings 537 can vary in number, shape and arrangement.

Figure 16:
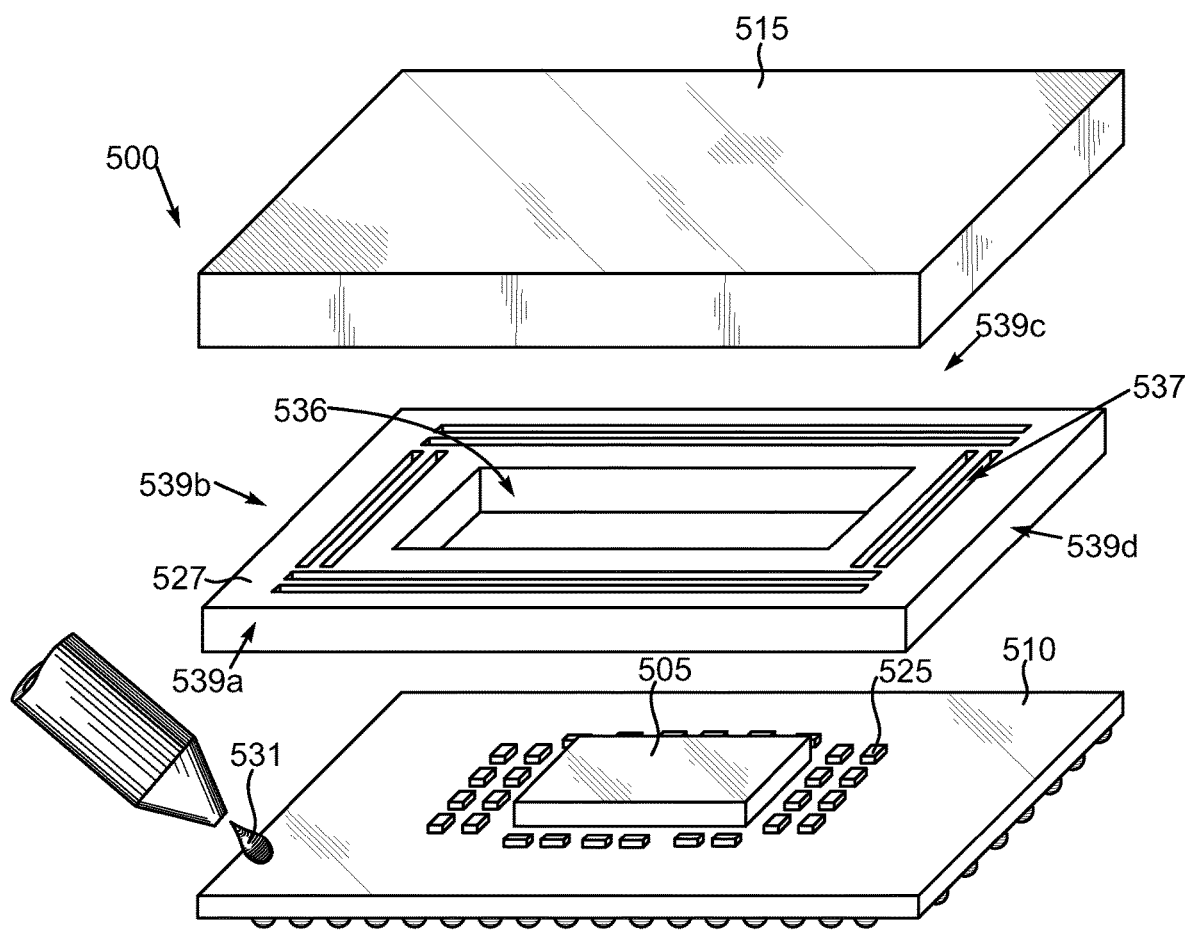
FIG. 16 is a partially exploded pictorial view of another alternate exemplary arrangement of a semiconductor chip package that includes a stiffener ring.

Another alternate exemplary arrangement of a semiconductor chip package 500 is shown in a partially exploded pictorial view in FIG. 16. In this illustrative arrangement of the package 500, a semiconductor chip 505 is mounted on a package substrate 510 where the chip 505 and the package substrate 510 can be substantially like the chip 105 and package substrate 110 described elsewhere herein. Similarly, a molding layer 515 like the molding layer 115 can be used to encapsulate the semiconductor chip 505 and surface components 525 that are mounted on the package substrate 510. However, in lieu of using plural small anchor structures that mechanically engage the molding layer 515 and like the package 400 just described, a stiffener ring 527 is secured to the package substrate 510 by way of a suitable adhesive 531. The stiffener ring 527 includes a central opening 536 to accommodate the semiconductor chip 505 and the surface components 525 clustered around the semiconductor chip 505. In addition, the stiffener ring 527 includes plural openings 537, which in this illustrative arrangement consist of plural elongated slots, that are designed to allow portions of the molding layer 515 to flow therein during the molding process and thereby provide anchoring to the stiffener ring 527 after solidification. Note that the stiffener ring 527 is advantageously fabricated with a slightly smaller footprint than the package substrate 510 so that the molding layer 515 can mold around the sides 539a, 539b, 539c and 539d of the stiffener ring 527 during the molding process. In this way, the molding layer 515 can also mold to at least the perimeter of the upper surface of the package substrate 510. The stiffener ring 527 can be fabricated from aluminum, copper, stainless steel or the like using stamping, machining, forging, casting or other fabrication techniques. The openings 537 can vary in number, shape and arrangement.

Figure 17:
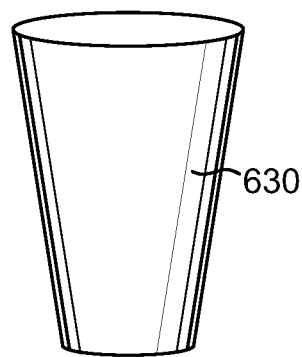
FIG. 17 is a pictorial view of an alternate exemplary anchor structure.

As noted above, other than a purely cylindrical structure can be used for the anchor structures 130 shown in FIGS. 1 and 2. For example, and as shown in FIG. 17, an alternate exemplary anchor structure 630 can have a generally frustoconical shape with an upward taper as shown to provide greater anchoring capability than a purely cylindrical structure. Of course, the photolithography used to create tapered plating mask holes can be tailored accordingly to achieve the desired tapered profile.

Figure 18:
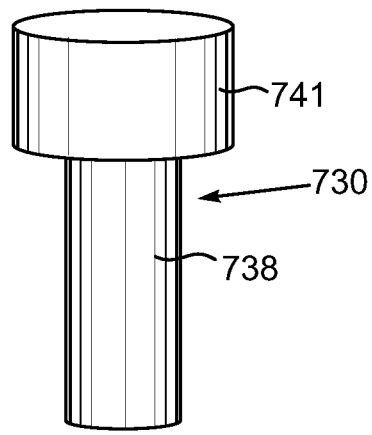
FIG. 18 is a pictorial view of another alternate exemplary anchor structure.

Optionally, and as shown in FIG. 18, another alternate exemplary anchor structure 730 can include a cylindrical shank 738 capped by a cylindrical head 741 as shown. Note that for a structure that has variable widths, like the anchor structure 730 that has two sections that have different diameters, namely the shank 738 and the head 741, the masking process used to establish the plating mask will require a two step masking exposure and development process in order to establish a plating mask hole that has a lower portion that is sized to accommodate the plating of the shank 738 and an upper but vertically aligned hole that has a larger diameter to accommodate the plating of the head 741.

Figure 19:
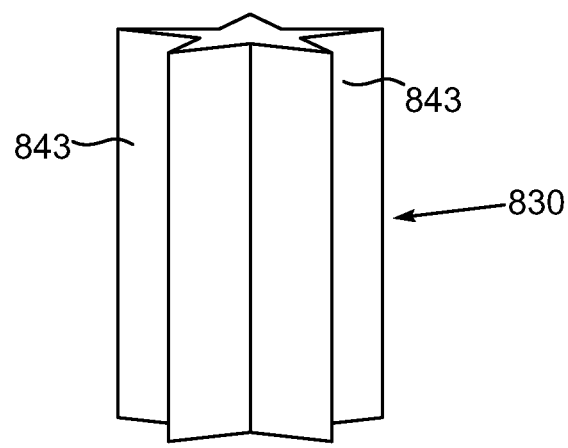
FIG. 19 is a pictorial view of another alternate exemplary anchor structure.

In yet another alternate exemplary arrangement of an anchor structure 830 depicted pictorially in FIG. 19, a star shaped footprint can be used that includes plural sides 843 that provide a greater surface area to adhere to a molding layer such as a molding layer 115 depicted in FIGS. 1 and 2. The illustrated arrangement of the anchor structure 830 has a five-point star footprint, but three or more points could be used.

Figure 20:
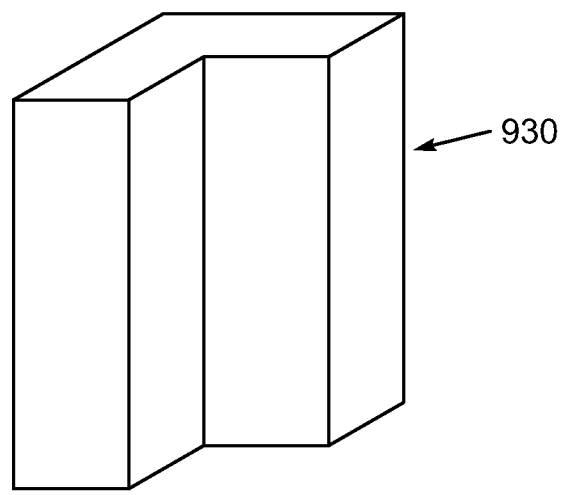
FIG. 20 is a pictorial view of another alternate exemplary anchor structure.

Finally, as shown in FIG. 20, an elbow shaped footprint can be used for an alternate exemplary anchor structure 930. Of course, these illustrate just a few possible footprints and shapes for anchor structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip package, comprising:
a package substrate having a first side and a second side opposite to the first side;
a semiconductor chip mounted on the first side;
plural metal anchor structures coupled to the package substrate and projecting away from the first side, wherein the plural metal anchor structures are coupled to a ground pathway or electrically floating, wherein the package substrate comprises plural metal pads, each of the anchor structures directly contacting one of the metal pads; and
a molding layer on the package substrate and at least partially encapsulating the semiconductor chip and the plural metal anchor structures, the plural metal anchor structures terminating in the molding layer and anchoring the molding layer to the package substrate.

2. The semiconductor chip package of claim 1, wherein the plural metal anchor structures comprise cylinders.

3. The semiconductor chip package of claim 1, wherein the plural metal anchor structures comprise frustoconical structures.

4. The semiconductor chip package of claim 1, wherein the plural metal anchor structures comprise a shank and a head.

5. The semiconductor chip package of claim 4, wherein the head is coined.

6. The semiconductor chip package of claim 1, wherein the plural metal anchor structures comprise bond wires.

7. The semiconductor chip package of claim 1, comprising plural surface components mounted on the first side.

8. The semiconductor chip package of claim 1, wherein the package substrate comprises a coreless build-up substrate.

9. A semiconductor chip package, comprising:
a package substrate having a first side and a second side opposite to the first side;
a semiconductor chip mounted on the first side;
a stiffener ring mounted on the first side, the stiffener ring being continuously formed and having a central opening to accommodate the semiconductor chip and plural openings; and
a molding layer on the package substrate and at least partially encapsulating the semiconductor chip and the stiffener ring, the plural openings being filled with portions of the molding layer wherein physical engagement of the portions in the plural openings anchor the molding layer to the package substrate.

10. A device comprising:
a semiconductor chip package, comprising:
a package substrate having a first side and a second side opposite to the first side; a semiconductor chip mounted on the first side;
plural metal anchor structures coupled to the package substrate and projecting away from the first side, wherein the plural metal anchor structures are coupled to a ground pathway or electrically floating, wherein the package substrate comprises plural metal pads, each of the anchor structures directly contacting one of the metal pads; and
a molding layer on the package substrate and at least partially encapsulating the semiconductor chip and the plural metal anchor structures, the plural metal anchor structures terminating in the molding layer and anchoring the molding layer to the package substrate.

11. The device of claim 10, wherein the plural metal anchor structures comprise cylinders.

12. The device of claim 10, wherein the plural metal anchor structures comprise frustoconical structures.

13. The device of claim 10, wherein the plural metal anchor structures comprise a shank and a head.

14. The device of claim 13, wherein the head is coined.

15. The device of claim 10, wherein the plural metal anchor structures comprise bond wires.

16. The device of claim 10, comprising plural surface components mounted on the first side.

17. The device of claim 10, wherein the package substrate comprises a coreless build-up substrate.

* * * * *